US012147345B2

(12) United States Patent
Williams et al.

(10) Patent No.: US 12,147,345 B2
(45) Date of Patent: *Nov. 19, 2024

(54) MANAGING MEMORY MAINTENANCE OPERATIONS IN A MEMORY SYSTEM HAVING BACKING STORAGE MEDIA

(71) Applicant: Rambus Inc., San Jose, CA (US)

(72) Inventors: Collins Williams, Raleigh, NC (US); Michael Miller, Raleigh, NC (US); Kenneth Wright, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 18/074,217

(22) Filed: Dec. 2, 2022

(65) Prior Publication Data
US 2023/0135017 A1 May 4, 2023

Related U.S. Application Data

(63) Continuation of application No. 16/868,088, filed on May 6, 2020, now Pat. No. 11,526,445.

(60) Provisional application No. 62/897,918, filed on Sep. 9, 2019, provisional application No. 62/846,974, filed on May 13, 2019.

(51) Int. Cl.
*G06F 12/08* (2016.01)
*G06F 12/0815* (2016.01)
*G11C 14/00* (2006.01)
(52) U.S. Cl.
CPC ...... *G06F 12/0815* (2013.01); *G11C 14/0018* (2013.01); *G06F 2212/1016* (2013.01)

(58) Field of Classification Search
CPC ............. G06F 12/0815; G06F 12/08; G06F 2212/1016; G11C 14/0018
USPC ................................................. 711/118, 141
See application file for complete search history.

(56) References Cited

U.S. PATENT DOCUMENTS

| 5,829,038 | A | 10/1998 | Merrell et al. |
|---|---|---|---|
| 10,157,657 | B2 | 12/2018 | Zheng et al. |
| 10,733,110 | B1 * | 8/2020 | Volpe .................... G06F 3/0656 |
| 2007/0101076 | A1 | 5/2007 | Dixon et al. |
| 2011/0087840 | A1 | 4/2011 | Glasco et al. |
| 2012/0284587 | A1 | 11/2012 | Yu et al. |
| 2014/0237189 | A1 | 8/2014 | Glasco et al. |
| 2016/0155491 | A1 | 6/2016 | Roberts et al. |
| 2016/0259729 | A1 | 9/2016 | Persson |
| 2019/0065382 | A1 * | 2/2019 | Velayuthaperumal ...................... G06F 3/065 |

(Continued)

FOREIGN PATENT DOCUMENTS

| WO | WO-2016-123748 | A1 | 8/2016 | |
|---|---|---|---|---|
| WO | WO2016123748 | * | 8/2016 | ............. G06F 12/08 |

*Primary Examiner* — Than Nguyen
(74) *Attorney, Agent, or Firm* — Lance Kreisman; Peninsula Patent Group

(57) ABSTRACT

Memory controllers, devices, modules, systems and associated methods are disclosed. In one embodiment, a memory system is disclosed. The memory system includes volatile memory configured as a cache. The cache stores first data at first storage locations. Backing storage media couples to the cache. The backing storage media stores second data in second storage locations corresponding to the first data. Logic uses a presence or status of first data in the first storage locations to cease maintenance operations to the stored second data in the second storage locations.

18 Claims, 4 Drawing Sheets

(56) References Cited

U.S. PATENT DOCUMENTS

2019/0347048 A1\* 11/2019 Kazama ................ G06F 3/0673
2021/0109657 A1\* 4/2021 Amidi ................. G06F 11/1004

\* cited by examiner

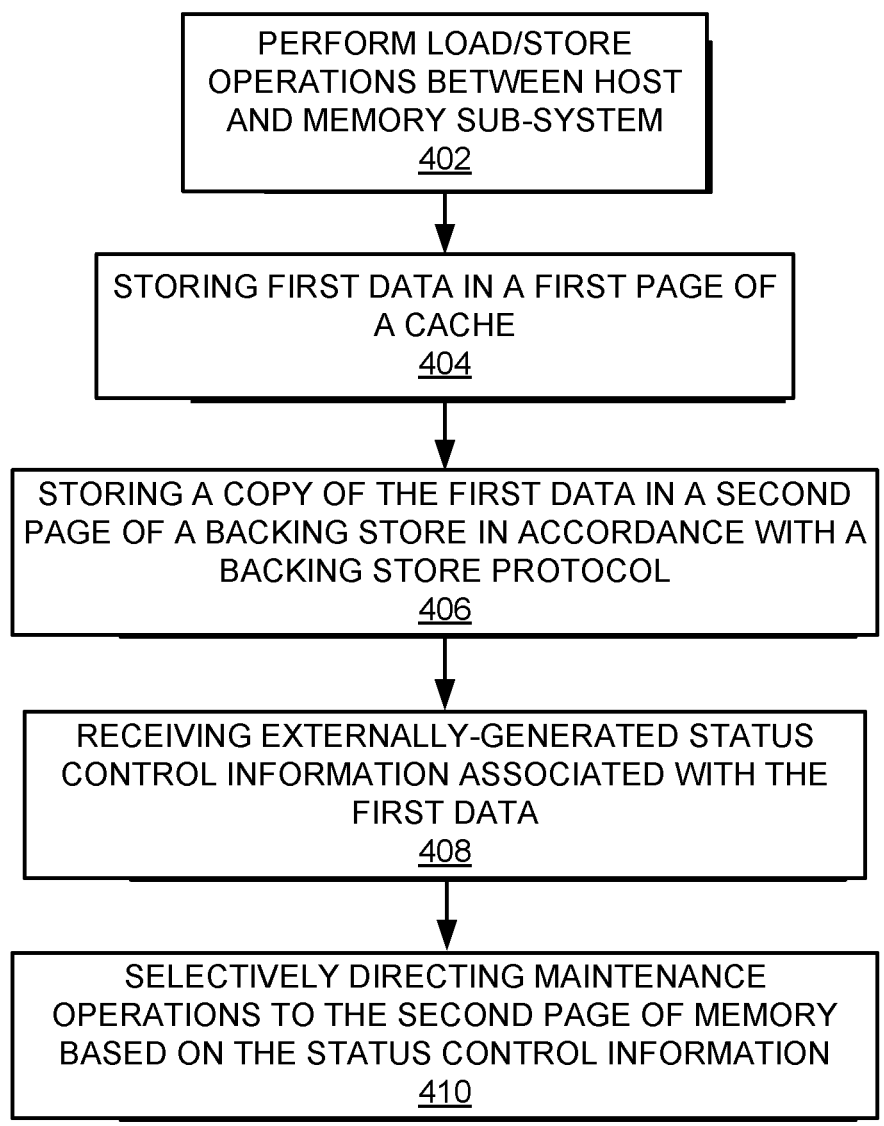

MANAGING MEMORY MAINTENANCE OPERATIONS IN A MEMORY SYSTEM HAVING BACKING STORAGE MEDIA

CROSS-REFERENCE TO RELATED APPLICATIONS

This application is a Continuation of U.S. patent application Ser. No. 16/868,088, filed May 6, 2020, entitled MANAGING MEMORY MAINTENANCE OPERATIONS IN A MEMORY SYSTEM HAVING BACKING STORAGE MEDIA, which is a Non-Provisional that claims priority to U.S. Provisional Application No. 62/846,974 filed May 13, 2019, entitled HYBRID MEMORY AND FLASH MEMORY MANAGEMENT OPTIMIZATIONS, and U.S. Provisional Application No. 62/897,918, filed Sep. 9, 2019, entitled MANAGING MEMORY MAINTENANCE OPERATIONS, all of which are incorporated herein by reference in their entirety.

TECHNICAL FIELD

The disclosure herein relates to memory modules, memory controllers, memory devices, and associated methods.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 4 illustrates further detail of another embodiment of a flow chart of steps relating to the evaluating status information step for the backing store management operations shown in FIG. 2.

DETAILED DESCRIPTION

Memory systems, memory modules, memory controllers, memory devices and associated methods are disclosed. In one embodiment, a memory system is disclosed. The memory system includes volatile memory configured as a cache. The cache stores first data at first storage locations. Backing storage media couples to the cache. The backing storage media stores second data in second storage locations corresponding to the first data. Logic uses a presence or status of first data in the first storage locations to cease maintenance operations to the stored second data in the second storage locations. By ceasing maintenance operations depending on a status of data in the cache, various costs associated with the maintenance operations for the backing storage media may be minimized.

Figure 1:
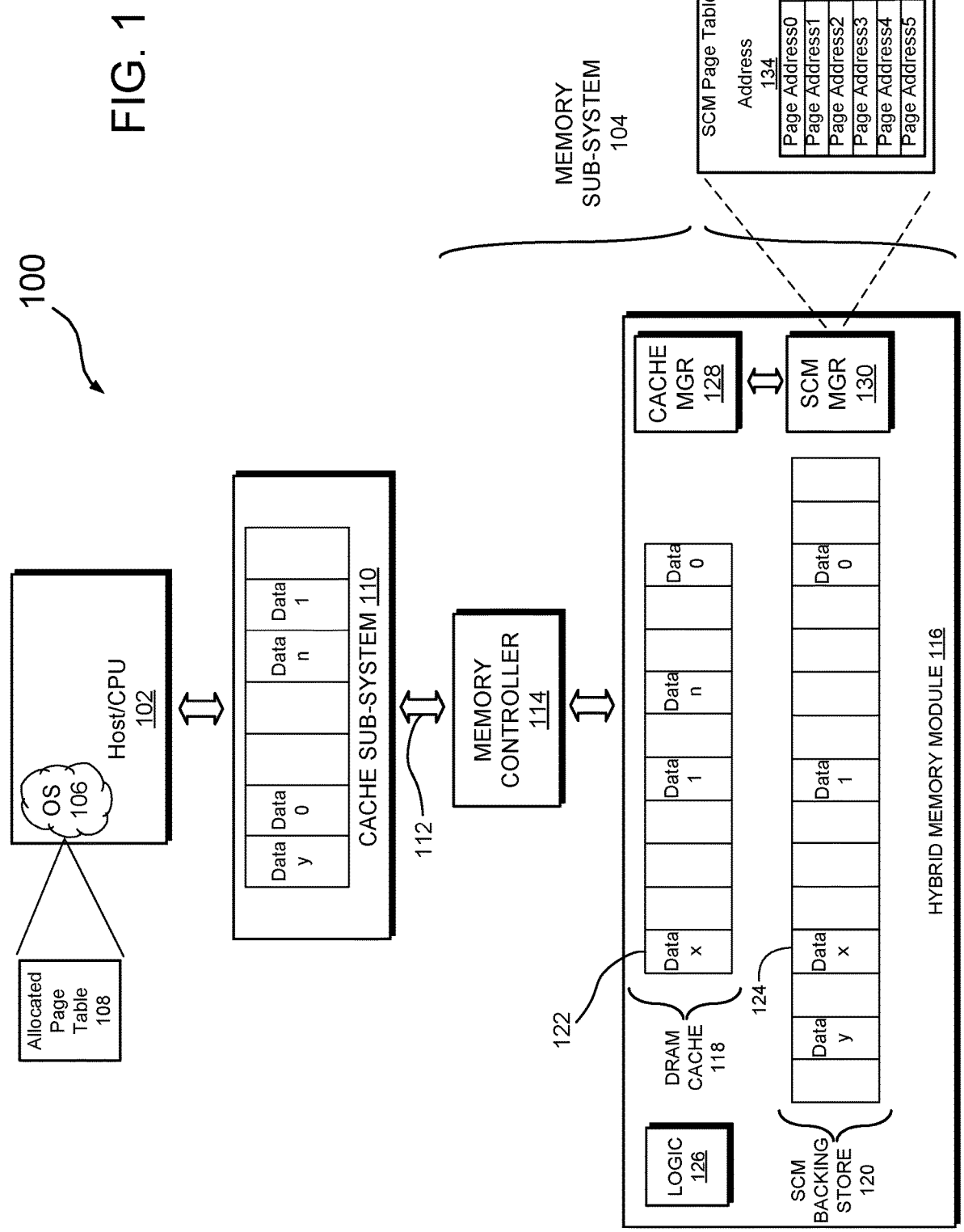
FIG. 1 illustrates one embodiment of a memory hierarchy utilizing a hybrid memory sub-system.

With reference to FIG. 1, one embodiment of a computing system, generally designated 100, employs a central processing unit (CPU) 102 that acts as a system host with respect to operations involving a memory subsystem 104. Operating system (OS) software 106 generally manages the CPU-related hardware resources of the computing system 100. In one embodiment, the operating system software 106 generates and maintains an allocated page table 108 that identifies the allocated memory, or "active memory", in the memory sub-system 104. Generally, a "page" may be viewed as a unit of memory from the perspective of the operating system software 106. The page table information is stored in the memory sub-system during system operation and is retrievable upon request from the operating system software or other application or process. The allocated page table 108 thus serves as a mapping of the physical memory used during system operation from the perspective of the Host/CPU 102.

For one embodiment, the host/CPU 102 interfaces with a first cache sub-system 110 that may employ a multi-level hierarchy. In some embodiments, the cache sub-system may reside on the host/CPU 102 as on-chip cache memory. Cache lines that become "dirty" are generally dispatched to the memory sub-system 104 for storage. For one embodiment, the cache sub-system 110 interfaces with the memory sub-system 104 via a high-speed serial interface such as Open-CAPI, or GEN-Z, at 112. The high-speed serial interface generally supports a basic "load/store" command protocol and may be employed for coherent communications between the host/CPU 102 and other sub-systems, such as graphics accelerators, network controllers, main memory, bulk memory, and the like.

Further referring to FIG. 1, for one embodiment the memory sub-system 104 takes the form of a hybrid memory that includes a memory controller 114 and a hybrid memory module 116. Although this description generally refers to "hybrid" memory, the embodiments described need not be hybrid and can be used in any system with a cache and a backing store, regardless of the memory being the same, different, volatile, or non-volatile. For one embodiment, the memory controller 114 is optimized to employ a command protocol involving only "load" (read or retrieve) and "store" (write) commands. For other embodiments, as more fully explained below, the command protocol may be expanded to include other commands or control "primitives" that dictate page status information. In some embodiments, the memory controller 114 may be embodied as an integrated circuit chip. Other embodiments may realize the memory controller as a sub-circuit in a general-purpose processor. Specific embodiments for the memory controller 114 may be compliant with various DRAM standards, including double data rate (DDR) variants, low power (LPDDR) versions, graphics (GDDR) types, and storage class memory (SCM) standards, such as resistive random access memory (ReRAM), magnetoresistive random access memory (MRAM), various forms of flash memory, and so forth.

With continued reference to FIG. 1, for one embodiment, the hybrid memory module 116 includes a DRAM cache memory 118 and an SCM backing store memory 120. The DRAM cache memory 118 generally includes one or more DRAM memory devices configured as a cache and provides a given number of storage locations in terms of "pages" (corresponding to a unit of data described above), such as at 122, for storing data. The SCM backing store memory 120 includes one or more SCM memory devices configured as a backing store, with a storage capacity at least as large as the cache memory 118, and including page locations, such as at 124, that may correspond to those of the DRAM cache memory 118. Logic 126, such as a field-programmable gate array (FPGA), provides on-chip local processing resources for a cache manager 128, which controls aspects of the DRAM cache 118, and a flash manager 130, which controls aspects of the SCM backing store memory 120. In some embodiments, the logic 126 and the memory controller 114 may be merged into a common circuit.

For some embodiments, the architecture of FIG. 1 may vary somewhat, depending on the application. For example, the memory controller 114 may reside on a substrate (or board) common with the Host/CPU 102, and optionally with additional logic in the form of buffer circuitry to form a "Buffer-on-Board" (BOB) architecture. In other embodiments, the memory controller may reside on the memory module 116, with the logic 126 formed as a buffer and cooperating with the memory controller as a "Buffer-on-Module" (BOM) architecture. Further, while the cache 118 and backing store 120 are shown formed on a common module, in some embodiments they may be formed on separate modules and connected to a common BOB architecture.

For one embodiment, more fully explained below, the flash manager 130 cooperates with the cache manager 128 to monitor states or presence of data stored in various pages of the DRAM cache memory 118. The monitoring generally involves evaluating status information for data stored in each of the pages of the DRAM cache memory 118, with the understanding that the "status" information represents an indicator for a status (managed/unmanaged) of data in a page, or an indicator of its presence in the page. As data in each page is confirmed, the page status as managed or unmanaged may be recorded in storage, such as a look-up table or register, and updated as a new status is detected. FIG. 1 illustrates one embodiment of an SCM page table 132 managed by the flash manager 130, with fields including Page Address 134 and Status 136. Additional or fewer fields may be included in the table, with an ability to track status information for data stored in the DRAM cache pages.

While the OS 104 monitors and maintains a table of allocated pages for the entire memory sub-system, as specific pages "retire" or become "unallocated" and removed from the OS page table, those same pages typically remain in the backing store memory and undergo maintenance operations as a default. The maintenance operations may include logical to physical address translation for all pages in a logical address space, block memory management, wear leveling, erroneous data management, and so forth. Each of these maintenance operations often involves a cost in terms of degradation, latency and power.

To reduce the costs associated with the maintenance operations noted above, the architecture shown in FIG. 1 provides flexibility in how selective disabling of maintenance operations for a backing store are controlled. For some embodiments, the control may be dictated via logic disposed locally with the cache and backing store. Local control may be undertaken by the memory controller 114 and/or logic 126 to control the cache manager 128 and the flash manager 130. In such a "local" control embodiment, described more fully with respect to FIG. 3, the flash manager 130, in addition to monitoring cache page status information, uses the status information to control how the maintenance operations are directed to the various pages of backing store memory. Where a page address is identified as "unmanaged" in the SCM page table, the corresponding page in the backing store memory will be excluded from maintenance operations. In other embodiments, control over selectively disabling backing store maintenance operations may be handled remotely, such as by the Host/CPU 102 via a command and/or primitives protocol. Such an example is described below with respect to FIG. 4.

Figure 2:
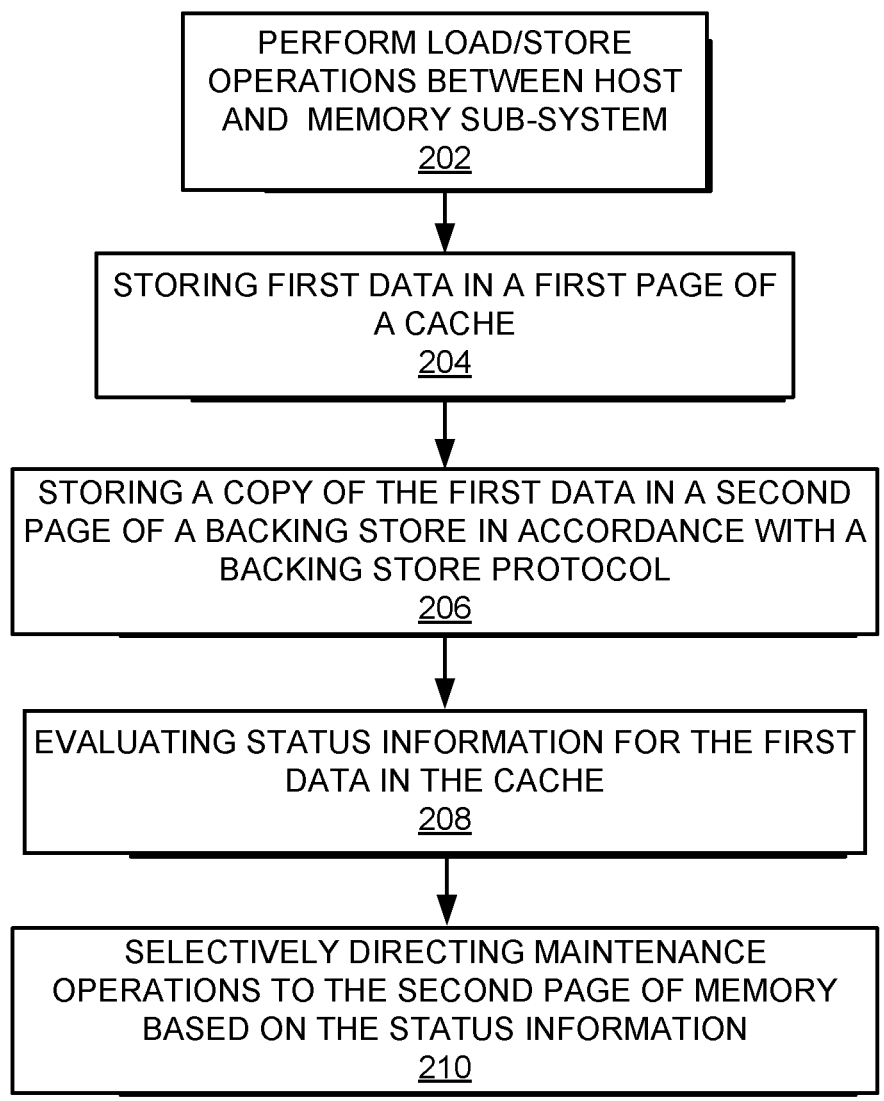
FIG. 2 illustrates one embodiment of a flow chart of steps relating to backing store management operations for the hybrid memory module shown in FIG. 1.

FIG. 2 illustrates a flow chart of steps describing a high-level method of operation for the computing system of FIG. 1 that takes advantage of selective maintenance operations for the hybrid memory. Many of the steps in the figures that follow involve policies and protocols that may vary widely. However, one embodiment for a minimum set of rules for one cache policy involving a DRAM cache and SCM backing store include recognizing that 1) not all data may be present in both the cache and the backing store but is present in their union, or in neither; 2) data that is only in cache has not yet been cast out to the backing store; 3) data that is only in the backing store has been cast out and not yet recalled to the cache; 4) data items that are present in both the cache and backing store are either identical or more current in the cache; and 5) data in neither place are assumed to have the default state or a don't care state.

Further referring to FIG. 2, as the host/CPU 102 carries out its processing operations, including generating a stream of load/store operations, data stored in pages of the local cache sub-system 108 may eventually be transferred down the memory hierarchy to the hybrid memory 124 via one or more "store" operations, or the host/CPU may retrieve data stored in the hybrid memory 124 via one or more "load" operations. This stream of operations generally results in the performing of load/store operations between the host/CPU and the hybrid memory, at 202. In response to a single store command from the Host/CPU, one or more given units of data (such as a "page" of data) may be stored in a first page of the DRAM cache 118, at 204. At some point, in accordance with an enforced backing store protocol, a copy of the first page of data may be cast out and stored in the SCM backing store memory, at 206.

With continued reference to FIG. 2, data stored in the backing store is evaluated, at 208, to determine its status (or presence) in the DRAM cache. This may be accomplished in various ways, such as via the local SCM manager 130, more fully described below with respect to steps illustrated in FIG. 3, and/or via status-centric command/control information generated remotely, more fully described below with respect to steps illustrated in FIG. 4. Regardless of how the status information is evaluated, SCM maintenance operations are selectively directed to the SCM backing store page based on the status information, at 210. Thus, for pages of the DRAM cache that are identified with a status of "managed", a corresponding page in the backing store memory will be involved in any SCM memory maintenance operations. However, for pages of the DRAM cache that are identified with a status of "unmanaged", the corresponding page in the backing store memory will not undergo the maintenance operations, thereby reducing unnecessary memory maintenance costs.

Figure 3:
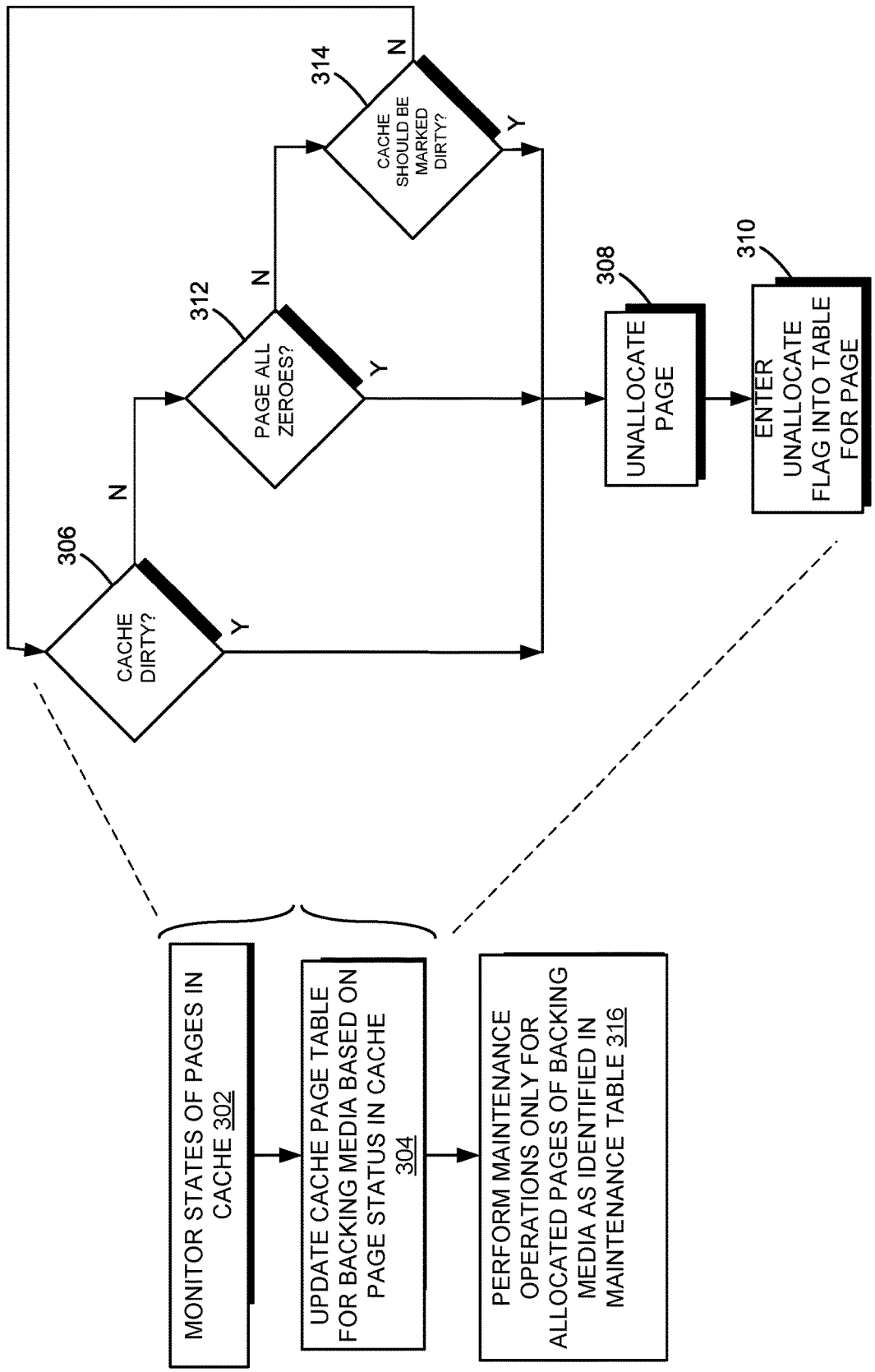
FIG. 3 illustrates further detail of one embodiment of a flow chart of steps relating to the evaluating status information step for the backing store management operations shown in FIG. 2.

FIG. 3 illustrates one specific embodiment for locally evaluating status information for data stored in DRAM cache pages. The local evaluation is carried out by the SCM manager 130, which interacts with the cache manager 128 for information concerning data stored in the DRAM cache. Thus, the SCM Manager can monitor the states of data stored in the pages of the DRAM cache 118. For one embodiment, when initially stored in the SCM backing store 120, the SCM manager 130 updates the SCM page table 132 to reflect that the page address just stored is "managed." Subsequent monitoring may detect one or more conditions such as an indicator from the DRAM cache 118 that the cache is dirty, at 306, or that a given page of data includes only zeroes (often referred to as a "Start of Day" condition occurring at startup/initialization), at 312, or that the cache should be marked dirty, at 314. If the SCM Manager detects one or more of these events, then the SCM page table is updated for that particular page address, at 304. Specifically, this may include flagging the associated page in the SCM page table as "unmanaged", at 308, and entering the "unmanaged" status information into the SCM page table, at 310. Maintenance operations for the backing store memory are then only performed, at 316, for pages of the backing store memory that correspond to managed cache pages identified in the SCM page table 132.

As an example of detecting an "unmanaged" status, a copy of a page of data in the SCM backing store 120 may no longer be authoritative when the corresponding page in the DRAM cache 118 becomes "dirty." Generally, data in the cache is viewed as "dirty" if it has been modified within the cache, but not (yet) correspondingly modified in a lower level of the memory (such as the SCM backing store 120). For instance, and referring back to the system of FIG. 1, in the event the Host/CPU 102 instructs the memory subsystem 104 to "store data x", the memory controller 114 responds by issuing a store command, along with the data corresponding to data x to the DRAM cache 118. The cache manager 128 communicates with the SCM manager 130 to convey that the page in cache has been updated, and to stop managing the data in the SCM backing store page corresponding to the page in cache storing the updated data x. The SCM manager 130 then updates the SCM page table 132 to prevent maintenance operations from being directed to the backing store memory page storing the previous copy of data x.

In another specific example, the local evaluation of data states may involve having the SCM manager 130 transferring ownership of a page of data to the cache manager 128. Since the SCM manager 130 is relinquishing responsibility for maintaining the data, it may thus cease maintenance operations to that page. In yet another embodiment, the logic 126 or local memory controller 114 may utilize a "dirty flag" to itself identify portions of its own data that are in the cache and don't need to be maintained in the backing store media. In such an embodiment, the dirty flag may indicate that the data in the cache is not represented in the backing store (i.e. it is "dirty" with respect to the backing store.) It may be set by the cache manager when the cache is updated and the backing store has not yet been updated. With the SCM manager transferring responsibility for the data in question to the cache manager, the dirty bit is used by the cache manager to track the fact that the cache manager must track the data until it can be written back to the backing store.

FIG. 4 illustrates one specific embodiment for remotely evaluating status information for data stored in DRAM cache pages. For one embodiment, the remote evaluation may be carried out by the Host/CPU 102, which dispatches commands and/or control information concerning "status" of data stored in the DRAM cache. The specialized commands and control information may be in addition to typical memory protocol commands and control information pertaining to the specific memory devices employed in the hybrid memory module 116.

With the above in mind, and further referring to FIG. 4, as the host/CPU 102 carries out its processing operations, including generating a stream of load/store operations, data stored in pages of the local cache sub-system 108 may eventually be transferred down the memory hierarchy to the hybrid memory 124 via one or more "store" operations, or the host/CPU may retrieve data stored in the hybrid memory 124 via one or more "load" operations. This stream of operations generally results in the performance of load/store operations between the host/CPU and the hybrid memory, at 402. In response to a single store command from the Host/CPU, one or more given units of data (such as a "page" of data) may be stored in a first page of the DRAM cache 118, at 404. At some point, in accordance with an enforced backing store protocol, a copy of the first page of data may be cast out and stored in the SCM backing store memory at a location corresponding to the first page of the DRAM cache, at 406.

For some situations, and with continued reference to FIG. 4, the Host/CPU may communicate that it has no more need for a given page of data, such that the hybrid memory may be able to 1) re-use that page in the cache, 2) avoid writing it out to the SCM backing store memory, and/or 3) avoid copying the data when blocks of the SCM backing store memory are "migrated", consolidated, or otherwise transferred between locations. The Host/CPU may thus issue page-related status commands or control primitives that alert the hybrid memory of the status. The hybrid memory then receives the externally-generated status command/control information associated with page data, at 408. One example of such a command includes an "invalidate" command, which signals to the hybrid memory that it may dispose of a given page of memory associated with the command. A similar command may involve a "Load-Invalidate" command, which instructs the hybrid memory to return current data and then dispose of it. A further command may involve instructing the hybrid memory that a given page has a status of "Read-Only." Such a command provides a status where the host will be issuing no further stores to that page. Examples of control primitives which may be directed to the memory sub-system may include information indicating that a page is no longer in use, or that a page will soon no longer be used.

Further referring to FIG. 4, once the command/control information is received by the hybrid memory, it may selectively direct SCM maintenance operations to the second page of memory based on the status control information, at 410.

For some embodiments, in addition to receiving status information via externally-generated commands/control information, the hybrid memory may include the capability to generate and transmit a signal from the hybrid memory to the Host/CPU. Such a signal might comprise an alert signal that recently loaded data to a page identified in a load command is all "0s". This may be useful to shorten a load command to a single response instead of explicit "0"s for all of the data requested.

Those skilled in the art will appreciate that the system, sub-systems, and associated methods described above enable an efficient memory management scheme for selectively directing maintenance operations in an SCM backing store of a hybrid memory. By reducing unnecessary maintenance operations in the SCM backing store, significant cost reductions in terms of power and processing resources may be realized.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., $\overline{\text{<signalname>}}$) is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A memory, comprising:
cache memory to store first data;
backing storage media coupled to the cache memory, the backing storage media to store second data corresponding to the first data in a hierarchical relationship; and
buffer circuitry coupled to the cache memory and the backing store media to cease maintaining the correspondence of the second data to the first data when a status of the first data indicates that the first data no longer corresponds to the second data.

2. The memory of claim 1, wherein:
the first data is stored in a first page of volatile memory storage cells; and
the second data is stored in a second page of storage class memory (SCM) storage cells.

3. The memory of claim 2, wherein:
the volatile memory storage cells comprise dynamic random access memory (DRAM).

4. The memory of claim 2, wherein:
the SCM storage cells comprise non-volatile memory cells.

5. The memory of claim 4, wherein:
the non-volatile memory cells comprise flash memory cells.

6. The memory of claim 1, wherein the buffer circuitry further comprises:
a cache manager circuit to manage operations directed to the cache memory; and
a backing store media manager circuit to manage the backing store media.

7. The memory of claim 6, further comprising:
storage configured as a lookup table to store page allocation information identifying managed/unmanaged backing store pages corresponding to the status of the first data stored in the cache.

8. The memory of claim 1, wherein the buffer circuit further comprises:
an interface to receive commands generated by an external host, the commands specifying page-related status information for the first data in the cache memory.

9. A memory module, comprising:
a substrate;
a memory sub-system including
cache memory to store first data;
backing storage media coupled to the cache memory, the backing storage media to store second data corresponding to the first data; and
buffer circuitry to selectively cease maintaining the correspondence of the second data to the first data when a status of the first data indicates that the first data no longer corresponds to the second data.

10. The memory module of claim 9, wherein:
the backing storage media comprises multiple flash memory devices.

11. The memory module of claim 9, wherein the buffer circuitry further comprises:
a cache manager circuit to manage operations directed to the cache memory; and
a backing storage media manager circuit to manage the backing storage media.

12. The memory module of claim 11, further comprising:
storage configured as a lookup table to store page allocation information identifying managed/unmanaged backing store pages corresponding to the status of the first data stored in the cache.

13. The memory module of claim 9, wherein the buffer circuitry further comprises:

an interface to receive commands generated external to the memory module, the commands specifying page-related status information for the first data in the cache memory.

14. The memory module of claim 13, wherein:

the page-related status information includes at least one from the group comprising data unallocation, data load and unallocation, and data read-only.

15. A method of operation in a memory system, the method comprising:

storing first data at first volatile memory storage locations in a cache memory;

selectively storing a copy of the first data as stored second data in a second location of a backing storage media for the cache memory, and ceasing maintaining the correspondence of the second data to the first data when a status of the first data indicates that the first data no longer corresponds to the second data.

16. The method of claim 15, wherein:

the selectively maintaining the copy of the second data with respect to the first data is controlled locally on a memory module by buffer circuitry, the cache memory, the buffer circuitry and the backing storage media disposed on the memory module.

17. The method of claim 16, wherein the buffer circuitry includes a backing storage media memory manager circuit, and wherein the method further comprises:

detecting changes to data status of pages in the cache memory with the backing storage media memory manager circuit.

18. The method of claim 16, wherein:

the selectively maintaining the copy of the second data with respect to the first data is controlled by the buffer circuitry in response to commands generated remotely by a system controller host.

* * * * *